United States Patent [19]

Uehara et al.

[11] 4,336,438
[45] Jun. 22, 1982

[54] APPARATUS FOR AUTOMATIC SEMI-BATCH SHEET TREATMENT OF SEMICONDUCTOR WAFERS BY PLASMA REACTION

[75] Inventors: Akira Uehara, Yokohama; Hiroyuki Kiyota, Hiratsuka; Shigekazu Miyazaki, Sagamihara; Hisashi Nakane, Kawasaki, all of Japan

[73] Assignee: Tokyo Ohka Kogyo Kabushiki Kaisha, Kanagawa, Japan

[21] Appl. No.: 187,748

[22] Filed: Sep. 16, 1980

[30] Foreign Application Priority Data

Sep. 11, 1979 [JP] Japan .................. 54-124709[U]

[51] Int. Cl.³ .................. B23K 9/00; B65H 1/06
[52] U.S. Cl. .................. 219/121 PG; 219/121 PD; 219/121 EN; 219/121 PX; 198/339; 53/228; 271/275; 156/646; 156/643; 414/222
[58] Field of Search .................. 219/158–161, 219/121 EL, 121 EN, 121 EX, 121 PD, 121 PE, 121 PF, 121 PG, 121 PH, 121 PX; 198/339; 53/228; 271/275; 156/643, 646, 345; 204/192 E; 414/225, 222

[56] References Cited

U.S. PATENT DOCUMENTS

| | | | |
|---|---|---|---|
| 3,213,997 | 10/1965 | Fryer | 198/339 X |
| 3,623,719 | 11/1971 | Dokoupil et al. | 271/275 |
| 3,812,947 | 5/1974 | Nygaard | 198/339 |
| 4,149,923 | 4/1979 | Uehara et al. | 156/646 |
| 4,151,034 | 4/1979 | Yamamoto et al. | 219/121 PG |
| 4,208,159 | 6/1980 | Uehara et al. | 414/225 |
| 4,263,088 | 4/1981 | Gorin | 156/646 |

Primary Examiner—Elliot A. Goldberg
Assistant Examiner—M. Paschall
Attorney, Agent, or Firm—Armstrong, Nikaido, Marmelstein & Kubovcik

[57] ABSTRACT

An apparatus for automatic semi-batch sheet treatment of wafers such as high-purity silicon semiconductor wafers by plasma reaction is disclosed. The apparatus comprises a wafer carrying mechanism, a reaction chamber with an opening at the bottom, a wafer table disposed beneath the opening and provided with a subtable for mounting the wafer, and control devices for driving the above elements in linkage motion. The wafer carrying mechanism is substantially composed of a conveyor for carrying a wafer to be treated, a pair of open-close type wafer carrying wire conveyors which are spaced in parallel at a certain distance and open and close in linkage motion so that the wafer table may pass vertically therethrough to be fixed vacuum-tightly to the reaction chamber, a mechanism for opening and closing the wire conveyors and a treated wafer carrying conveyor. The subtable is vertically movable and capable of passing the wire conveyors when closed.

7 Claims, 10 Drawing Figures

4,336,438

APPARATUS FOR AUTOMATIC SEMI-BATCH SHEET TREATMENT OF SEMICONDUCTOR WAFERS BY PLASMA REACTION

BACKGROUND OF THE INVENTION

1. Field of the Invention

This invention relates to an apparatus for the automatic sheet (slice) treatment of wafers such as high-purity silicon semiconductor wafers by plasma reaction, and more particularly to the apparatus for the treatment of the wafer by plasma reaction with an improved wafer carrying means.

2. Description of the Prior Art

Recently, etching of a semiconductor wafer, as well as removal by ashing of a photoresist by use of an apparatus for treatment of wafer materials by gas plasma reaction, has become widely available in the field of the semiconductor industry. In the beginning, the apparatus for the treatment of wafer materials by gas plasma reaction was of batch-type, in which 20 to 25 sheets of wafers are placed on a wafer boat for the simultaneous treatment thereof in a reaction tube. As ultra-fine patterning of the circuit, enlargement of the wafer and labor-saving in the production were developed, the drawbacks of the batch-wise apparatus became apparent. These include low processing precision, scattering results from the treatment of wafers among wafers or parts of a wafer, time-taking manual handling of wafers for setting and damage of the wafer due to manual handling thereof, especially in the case of a large-sized wafer. These are the problems of the art which are to be solved.

In order to overcome the drawbacks of the batch-type apparatus as mentioned above, U.S. Pat. No. 4,151,034, for example, discloses a continuous gas plasma etching apparatus. In this apparatus, a workpiece is subjected to etching while the workpiece is on an endless belt turning in a reaction chamber to pass through the reaction chamber so that undesirably scattering results from the etching treatment are obtained. U.S. Pat. No. 4,189,923 also discloses an automatic apparatus for the treatment of wafer materials by plasma reaction, in which all elements of the apparatus are installed on an inclined base table to effect the downward movement of the wafer, and the wafer is to be stopped as required by a wafer stopper such as a nib or rotary block. Accordingly, there is the drawback that the wafer is liable to be damaged due to the stopper on stopping the wafer.

U.S. Pat. No. 4,094,722 also discloses a continuous etching apparatus for etching a semiconductor element using a plasma, in which an activated gas from a gas plasma is conducted into an airtight etching chamber and a rotatable support plate having a semiconductor element holder rotates between a semiconductor element feeding chamber and the etching chamber in order to continuously feed the semiconductor elements in large amounts. However, an airtight hollow chamber must be provided to contain the rotatable support plate because the etching treatment is effected under airtight conditions and a hatch, which is opened and closed as required, is also required to be provided in a separate position from the airtight etching chamber so that a semiconductor feeding means may be provided therebeneath.

Further, the present inventors propose an apparatus for the treatment of a wafer by plasma reaction in U.S. Pat. No. 4,208,159 in which a sheet by sheet treatment of a wafer is effected continuously with such remarkable advantage that the scatter resulting from the treatment of wafers becomes narrower, the scatter from the treatment of wafers among both central and peripheral portions of a large-sized wafer also becomes narrower, ultra-fine patterning of the circuit becomes available, the apparatus is labor-saving, damages of a large-sized wafer during treatment operations are eliminated; thus, overcoming the drawbacks of the conventional apparatus. Further, the treating time per one sheet of wafer is shortened. However, the apparatus is provided with a pair of pick-up driving mechanisms of revolving or parallel running-arm type which suck and release the wafer for carrying in a wafer carrying means. In order to avoid touching the clean resist surface, it is necessary to pick-up the wafer on its circumference, and this is important. This has the disadvantages that pick-up heads are required to be exchanged depending upon the size of the wafer materials, and pressure control on sucking portions of the pick-up must be effected depending on the weight of the wafer materials. Difference in weight of wafers after processing, especially large wafers, the weight difference will be big, and cannot be pick-up, or there will be a disadvantage of breakage due to strong suction. In other system in which wafers are blown up by means of gas being spurted from tiny holes, but this system will invited dirts and foreign matters onto wafers. Large wafers present difficult problems.

SUMMARY OF THE INVENTION

An object of this invention is to provide an apparatus for the automatic sheet by sheet semi-batch treatment of a wafer by the plasma reaction which is capable of readily carrying wafers, such as high-purity silicon semiconductor wafers of various sizes, shapes and materials.

Another object of this invention is to provide an apparatus for the automatic sheet-by-sheet semi-batch treatment of a wafer by plasma reaction which is capable of readily treating a wafer in a short period of time with no damage of the wafer during treating operations and with a narrow scatter of results from the treatment of respective wafers.

A further object of this invention is to provide an apparatus for the automatic sheet-by-sheet semi-batch treatment of a wafer by plasma reaction in which a unification of respective elements of the apparatus is readily available.

DETAILED DESCRIPTION OF THE PREFERRED EMBODIMENTS

The objects of the present invention are attained by use of an improved wafer carrying means having a pair of open-close type wafer carrying wire conveyors which open and close in linkage motion with a wafer table having a sub-table instead of a conventional wafer carrying means having a pair of wafer carrying belt conveyors to and from a plasma reaction chamber as described in U.S. Pat. No. 4,208,159 mentioned above as one of the prior arts.

The present invention provides an apparatus for the automatic sheet-by-sheet semi-batch treatment of a wafer by plasma reaction, which apparatus comprises a wafer carrying means substantially composed of a conveyor for carrying a wafer to be treated, a pair of open-close type wafer carrying wire conveyors (hereinafter simply referred to as "wafer carrying wire conveyors") spaced in parallel at a certain distance, means for opening and closing the wafer carrying wire conveyors, and a treated wafer carrying conveyor; a reaction chamber with an opening at the bottom; a wafer table disposed beneath the opening of the reaction chamber, vertically movable to be fixed vacuum-tightly to the opening of the reaction chamber at the uppermost position, and provided with a sub-table which is fitted vacuum-tightly in the center of the wafer table, and vertically movable by means of an elevator cylinder to take the wafer mounted thereon into and out of the reaction chamber; and a control means for driving the wafer carrying means, the reaction chamber, the wafer table and the sub-table in linkage motion; wherein the wafer to be treated is carried to a position beneath the opening of the reaction chamber and above the sub-table while the sub-table is in operation, it functions to fix wafers in a position under vacuum, the sub-table is extended upward for the wafer to be treated to be mounted thereon and taken up to a predetermined position above the wafer carrying wire conveyors, the wafer carrying wire conveyors are opened for the wafer table to be extended upward therethrough, the wafer table is extended upward to be fixed vacuum-tightly to the opening of the reaction chamber with the sub-table fitted therein and the wafer mounted thereon, the wafer is subjected to a plasma treatment, after completion of the treatment, the wafer table is returned to the predetermined position above the wafer carrying wire conveyors, the wafer carrying wire conveyors are being closed to be ready for receiving the treated wafer, the sub-table is returned to the original position while the treated wafer is mounted on the wafer carrying wire conveyors, the treated wafer is carried by the wafer carrying wire conveyors and a treated wafer carrying conveyor to be stacked in a cassette therefor or to be subjected to a succeeding step.

Figure 2A:
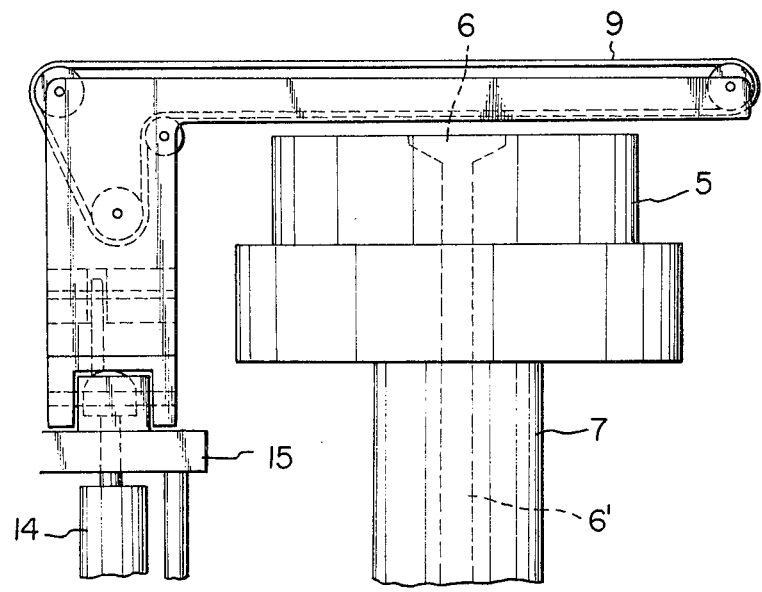
FIG. 2(A) is a detail front view of a pair of open-close type semiconductor wafer-carrying wire conveyors which open and close in the circumferential direction and means for opening and closing the wire conveyors.
Figure 2B:
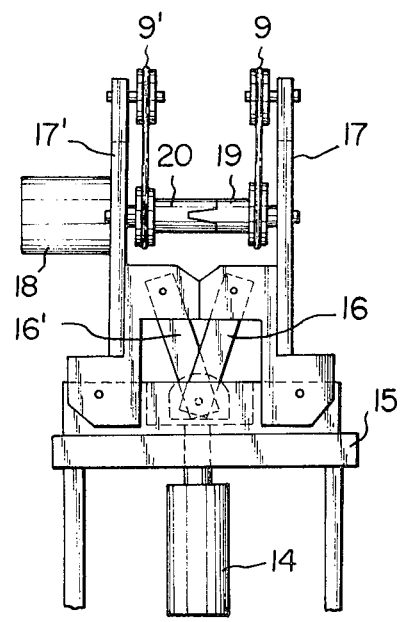
FIGS. 2(B) and 2(C) are explanatory side views of a pair of open-close type wafer carrying wire conveyors which open and close in an arcuate direction and means for opening and closing the wafer carrying wire conveyors.
Figure 2C:
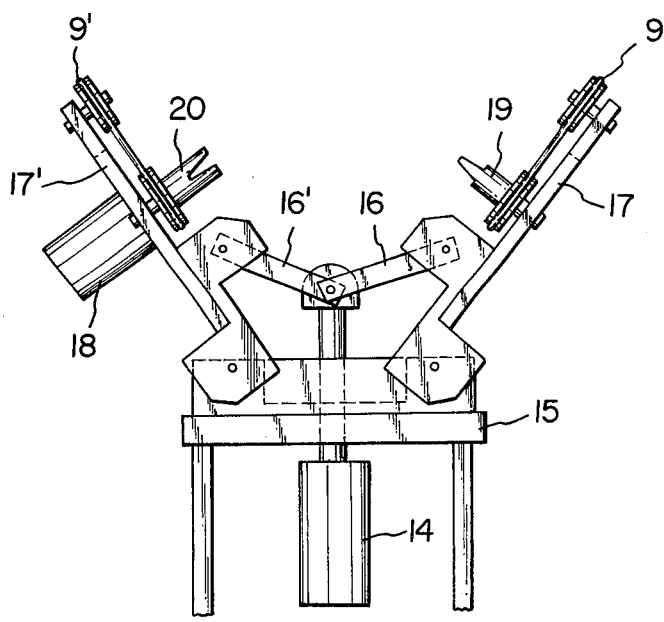

FIGS. 2(A), 2(B) and 2(C) show one embodiment of a means for opening and closing the wafer carrying wire conveyors, which is substantially composed of an elevator cylinder 14, a support 15, a pair of opening and closing arms 16,16', a pair of wafer carrying wire conveyor arms 17,17', a motor 18 and a pair of over-ride clutches 19,20 for holding the wafer carrying wire conveyor arms 17,17' and by which the open-close type wafer carrying wire conveyors 9,9' are opened and closed in the arcuate direction in linkage motion with the vertical movement of the elevator cylinder 14.

Figure 3A:
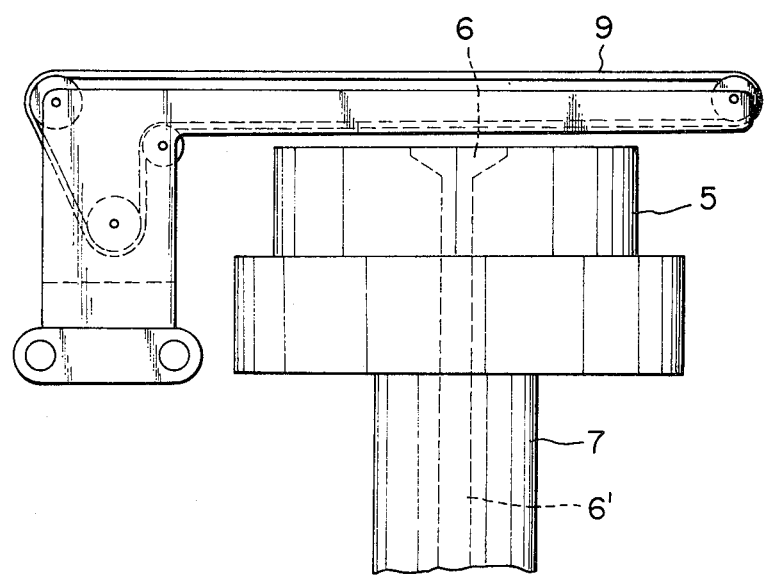
FIG. 3(A) is a detail front view of a pair of open-close type wafer-carrying conveyors which open and close laterally and means for opening and closing the wafer carrying-wire conveyors.
Figure 3B:
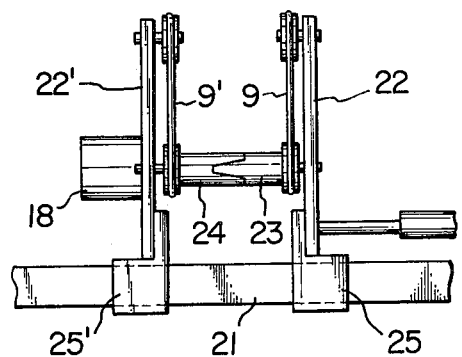
FIGS. 3(B) and 3(C) are explanatory side views of a pair of open-close type wafer carrying wire conveyors which open and close laterally and means for opening and closing the wafer-carrying wire conveyors.
Figure 3C:
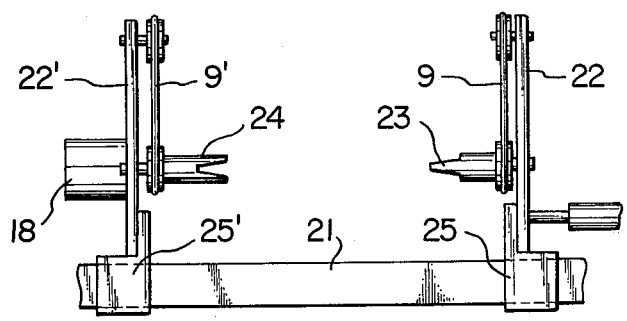

FIGS. 3(A), 3(B) and 3(C) show another embodiment of a means for opening and closing the wafer carrying wire conveyors, which is substantially composed of a wire conveyor arm slide shaft 21, a pair of wafer carrying wire conveyor arms 22,22', a pair of over-ride clutches 23,24 for holding the wafer carrying wire conveyor arms 22,22' and cylinders 25,25' for opening and closing the wafer carrying wire conveyor arms 22,22', and by which the wafer carrying wire conveyors 9,9' are opened and closed laterally as the wafer carrying wire conveyor arms 22,22' are opened and closed laterally by means of cylinders 25,25'.

The wafer carrying means in the apparatus of the present invention may further be composed of a wafer cassette mounted on a cassette elevator for supplying wafers to be treated, and a wafer cassette mounted on a cassette elevator for receiving treated wafers.

The wafer carrying wire conveyors may be spaced at such a distance that the wafer can be safely mounted thereon and that the sub-table can pass therebetween.

The sub-table of the present invention should have such a size that the wafer can be safely mounted thereon and that it can pass between a pair of wafer carrying wire conveyors.

The control means in the apparatus of the present invention is substantially composed of a microcomputer.

In accordance with the apparatus of the present invention, scatter in results occurring from the treatment of the respective wafers becomes narrow with no damage to the wafer during treating operations and the wafer can be treated automatically in a short period of time.

In accordance with the apparatus of the present invention, the wafer as an object of various sizes, shapes and materials can be readily carried out for the plasma treatment thereof. The size of the wafer may be, for example, in the range of from 1.5 to 6 inches in diameter. The shape of the wafer may be of any shape, for example, square or round. Examples of the material as an object may include a silicon wafer, a glass plate, a ceramic substrate and the like.

Further in accordance with the apparatus of the present invention, respective parts of the apparatus, such as a wafer supply part composed of a cassette elevator and a wafer cassette mounted thereon for supplying wafers to be treated, a reaction chamber part and the like can be unified to be controlled respectively by a microcomputer or the like. The unification of respective parts of the apparatus permits parts which fail to be readily discovered by providing a display for immediate exchange or repair thereof and consequently minimizes a shut-down in the semiconductor production line.

A plurality of supply parts or reaction chamber parts may be provided in parallel for combination. The electrode provided in the reaction chamber may be of a planar type or a coaxial or barrel type.

The control means of the apparatus in the present invention is substantially composed of a microcomputer. That is, the control means for bringing the individual parts into harmonized linkage motion may be a programmed control means well known in the control of various kinds of machine tools for automatic machining. For example, each of a plurality of cams fixed to a revolving shaft serves to start and stop the motion of one of the individual parts in a predetermined schedule. Alternatively the linkage motion can be controlled by a series of electric relays.

The apparatus of the present invention is further described with reference to the accompanying drawings.

Figure 1A:
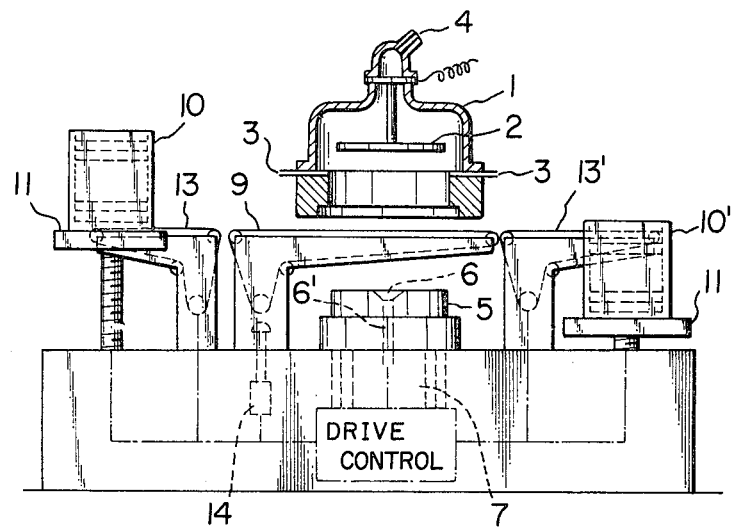
FIG. 1(A), 1(B), 1(C) and 1(D) are explanatory front views showing one embodiment of the apparatus of the present invention.
Figure 1B:
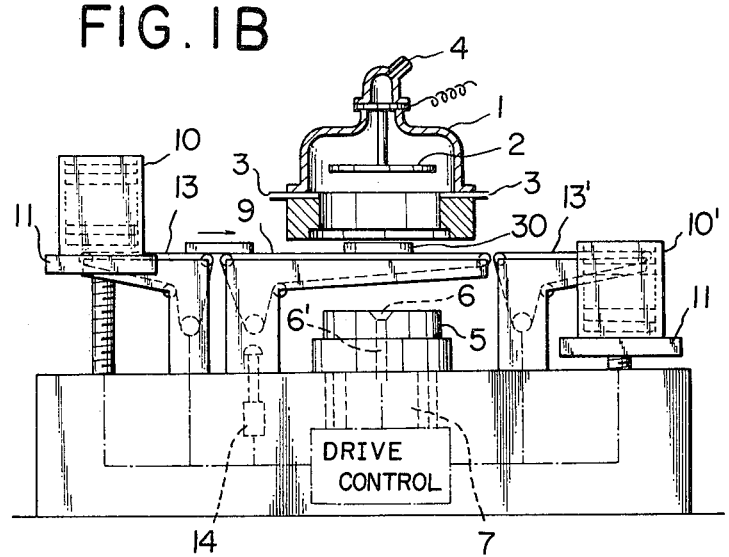
Figure 1C:
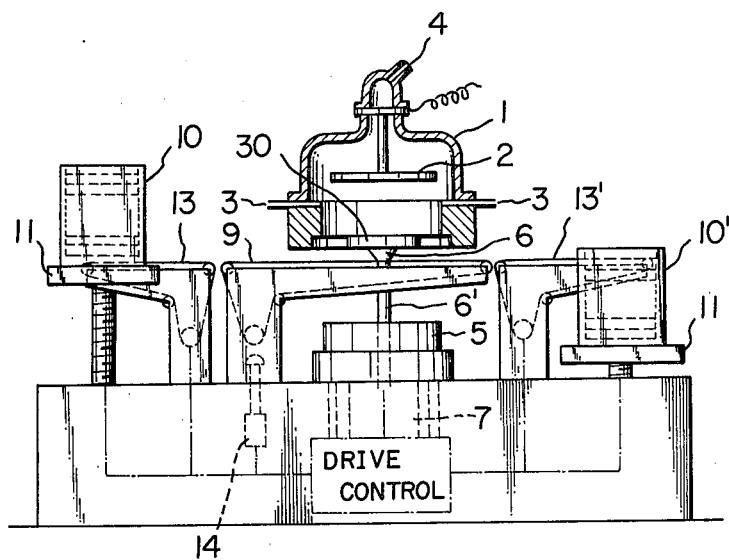

In FIG. 1(A), wafers to be treated are stacked in a wafer cassette 10 mounted on a cassette elevator 11. A lowermost wafer 30 stacked in the wafer cassette 10 is carried to a position beneath an opening of a reaction chamber 1 and above a sub-table 6 by means of a conveyor 13 for carrying a wafer to be treated and by a pair of open-close type wafer carrying wire conveyors 9, as shown in FIG. 1(B). As another embodiment, a wafer to be treated may be supplied directly from a preceding step by a conveyor (not shown) without being stacked in the wafer cassette 10. The sub-table 6 is extended upward for the wafer 30 to be mounted thereon and taken up to a predetermined position above the wafer carrying wire conveyors 9, as shown in FIG. 1(C). According to one embodiment, an elevator cylinder 14 extends upward for the open-close type wafer carrying wire conveyors 9,9' to be opened in an arcuate direction through a pair of wafer carrying conveyor arms 16,16' as shown in FIG. 2(C) and, according to another embodiment, the wafer carrying wire conveyor arms 22,22' are separated from each other laterally sliding on a wafer carrying wire conveyor arm slide shaft 21 by means of a pair of cylinders 25,25' for the open-close type wafer carrying wire conveyors 9,9' to be opened laterally as shown in FIG. 3(C). A sub-table 6 and a sub-table shaft 6' integrally provided with each other are vacuum-tightly fitted in a wafer table 5.

Figure 1D:
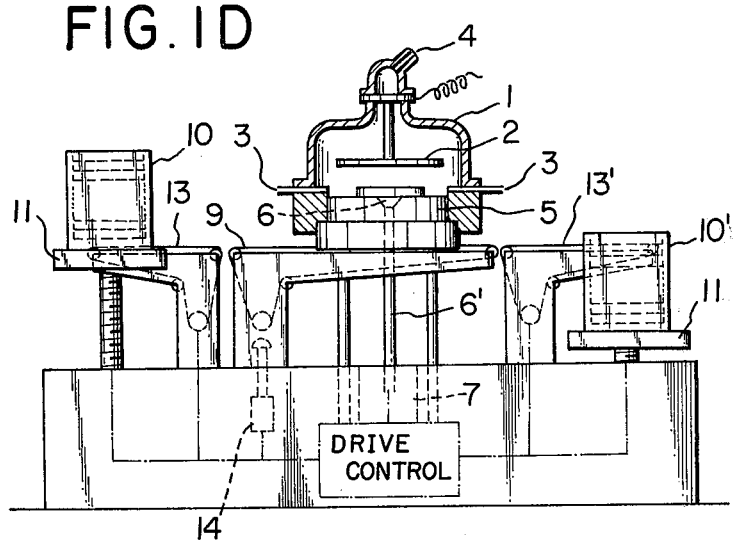

Following this, the wafer table 5 is extended upward through the opened wafer carrying wire conveyors 9, by means of an elevator cylinder 7 to be fixed vacuum-tightly to the opening of the reaction chamber 1 with the sub-table 6 fitted therein and the wafer 30 mounted thereon as shown in FIG. 1(D). The reaction chamber 1 is evacuated by a vacuum line 4 connected to a vacuum pump (not shown), and a gas for plasma treatment is introduced thereinto through a plasma gas nozzle 3. A plasma is generated under vacuum with a radio frequency generator (not shown) by the application of a high voltage electrode 2 for the treatment of the wafer 30 by plasma reaction. After completion of the treatment, the pressure inside the reaction chamber 1 is increased to atmospheric pressure. The wafer table 5 is returned to the original position while the sub-table 6 is returned to the predetermined position above the wafer carrying wire conveyors 9. The wafer carrying wire conveyors 9,9' are closed to be ready for receiving the treated wafer 30 thereon as shown in FIGS. 2(B) and 3(B). The sub-table 6 is returned to the original position while the treated wafer 30 is mounted on the wafer carrying wire conveyors 9,9'. The treated wafer 30 is carried by the wafer carrying wire conveyors 9,9' and a treated wafer carrying conveyor 13' to be stacked in a cassette 10' mounted on a wafer cassette elevator 11' or to be subjected to the succeeding step. The wafer table 5, the sub-table 6 and the wafer carrying wire conveyors 9,9' are operated in linkage motion and the upward and downward movements of the wafer table 5 and the subtable 6, and the opening and closing of the wafer carrying wire conveyors 9,9' are effected by means of a cylinder using a compressed gas or the like or by other means. The above procedure is carried out automatically in succession by a control means such as a microcomputer (not shown) located in the drive control as shown in FIG. 1(A).

It is readily apparent that the above-described invention meets all of the objects mentioned above and also has the advantage of wide commercial utility. It should be understood that the specific form of the invention hereinabove described is intended to be representative only, as certain modifications within the scope of these teachings will be apparent to those skilled in the art.

Accordingly, reference should be made to the following claims in determining the full scope of the invention.

What is claimed is:

1. An apparatus for the automatic sheet by sheet semibatch treatment of a wafer by plasma reaction, which apparatus comprises wafer carrying means substantially comprising along a horizontal longitudinal axis a conveyor for carrying a wafer to be treated, a pair of open-close type wafer carrying wire conveyors being parallel spaced at a certain distance, a means for opening and closing the wafer carrying wire conveyors operatively associated therewith, and a treated wafer carrying conveyor; a reaction chamber with an opening at the bottom disposed above wafer carrying wire conveyors; a wafer table disposed beneath the opening of the reaction chamber, vertically movable to be fixed vacuum-tightly to the opening of the reaction chamber at an uppermost position; a sub-table which is fittable vacuum-tightly in the center of the wafer table and is vertically movable separately therefrom; elevator means for vertically moving the wafer table and the sub-table to take the wafer mounted thereon into and out of the reaction chamber; and control means for driving the wafer carrying means, the reaction chamber, the wafer table and the sub-table in linkage motion.

2. The apparatus according to claim 1 wherein said means for opening and closing the wafer carrying wire conveyors comprises an elevator cylinder, a support, a pair of opening and closing arms pivotally connected to the elevator cylinder, a pair of wafer carrying wire conveyor arms pivotally mounted on the support with each having one of the opening and closing arms pivotally attached thereto, and a pair of over-ride clutches for holding the wafer carrying wire conveyor arms together in the closed position, said wafer carrying wire conveyors being opened and closed in an arcuate direction in linkage motion with the vertical movement of the elevator cylinder.

3. The apparatus according to claim 1 wherein said means for opening and closing the wafer carrying wire conveyors comprises a wafer carrying wire conveyor arm slide shaft, a pair of wafer carrying wire conveyor arms slidably mounted on the shaft, a pair of over-ride clutches for holding the wafer carrying wire conveyor arms together in the closed position, and a pair of cylinders for opening and closing the wafer carrying wire conveyor arms connected to the arms, said wafer carrying wire conveyors being opened and closed laterally as the wafer carrying wire conveyor arms are opened and closed laterally by the cylinders.

4. The apparatus according to claim 1 wherein said wafer carrying means further comprises a first wafer cassette mounted on a first cassette elevator for supplying the wafer to be treated, and a second wafer cassette mounted on a second cassette elevator for receiving the treated wafer.

5. The apparatus according to claim 1 wherein said wafer carrying wire conveyors are spaced at such a distance from each other that the wafer can be safely mounted thereon and that the sub-table can pass therebetween when the conveyors are in the closed position.

6. The apparatus according to claim 1 wherein said sub-table has such a size that the wafer can be safely mounted thereon and that the sub-table can pass between the wafer carrying wire conveyors when in closed position.

7. The apparatus according to claim 1 wherein said control means comprises a microcomputer.

* * * * *